United States Patent [15] 3,686,612
Clements [45] Aug. 22, 1972

[54] ELECTRICAL CONNECTOR

[72] Inventor: John W. Clements, Naperville, Ill.
[73] Assignee: Flexicon Electronics, Inc.

[22] Filed: March 5, 1968
[21] Appl. No.: 715,119

[52] U.S. Cl. ...........339/17 CF, 174/117 F, 317/100, 339/75 MP, 339/176 MF
[51] Int. Cl. ...............................................H05k 1/00
[58] Field of Search .......339/17, 75, 176; 174/117.1, 174/117.11, 117.11 FP, 117.11 HS; 317/100

[56] References Cited

UNITED STATES PATENTS

| | | | |
|---|---|---|---|
| 2,965,811 | 12/1960 | Batcher | 317/99 |
| 3,102,767 | 9/1963 | Schneck | 339/176 MP |
| 3,192,307 | 6/1965 | Lazar | 174/68.5 |
| 3,335,327 | 8/1967 | Damon et al. | 317/101 |
| 3,336,434 | 8/1967 | Crimmins | 174/72 |
| 3,380,016 | 4/1968 | Samson et al | 339/174 |
| 3,408,612 | 10/1968 | Bute et al | 339/17 CF |
| 3,440,722 | 4/1969 | Paulson | 29/626 |

*Primary Examiner*—Joseph H. McGlynn
*Attorney*—Francis T. Drumm

[57] ABSTRACT

Apparatus for electrically interconnecting a plurality of electronic components. In particular, an electronic interconnection system by means of which a plurality of electronic components may be electrically interconnected without the need for conventional pin and socket arrangements.

6 Claims, 18 Drawing Figures

Inventor
John W. Clements

Patented Aug. 22, 1972 3,686,612

4 Sheets-Sheet 2

Inventor:
John W. Clements

Inventor
John W. Clements

Inventor:
John W. Clements

ELECTRICAL CONNECTOR

SUMMARY

An electrical connection system for electronic components to form a complete integrated system. The system includes the electrical connection of microcircuit devices such as leadless inverted devices to a flat, flexible multi-conductored cable to which other electronic components are electrically connected. The system includes means for cooling the electronic microcircuits. The system also includes means for exerting compressive forces biasing the cable into conductive relation with a series of leadless inverted devices. The system contemplates the exerting of compressive forces as components of a tension force acting on the cable or cables. This tension force may be mechanically actuated by cam means, spring means or the like or may result from internal tensioning of a cable itself, as by irradiation or the like. The connection system of the invention obviates the need for conventional pin and socket arrangements. The invention contemplates the use of a programmed modifier strip by means of which the conductors of a multi-conductored flat cable may be selectively brought into conductive relation with certain contacts of a microcircuit. The modifier strip may be provided with conductive paths or may take the form of a blank having openings in preselected positions for selective contact between the cables and the edge contacts of a microcircuit. The electrical connections thus made may be temporary or permanents, as desired.

Figure 14:
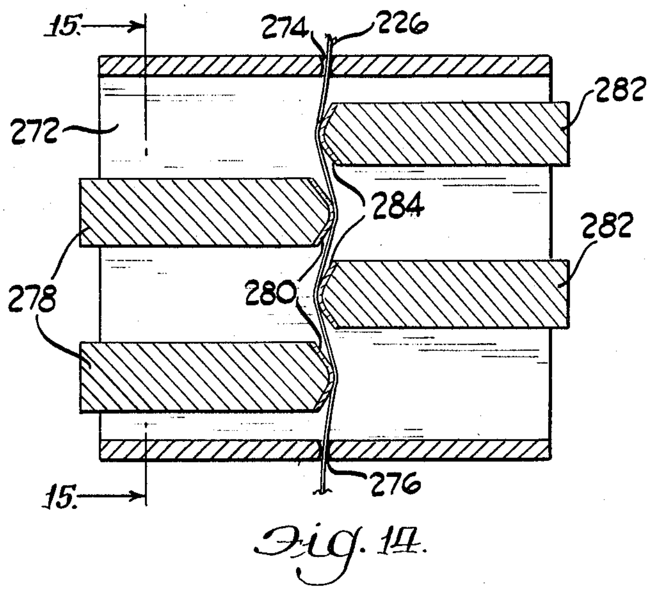
Figure 15:
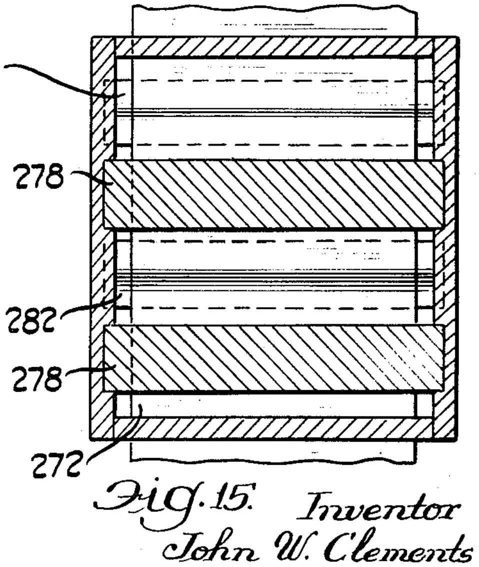
Figure 16:
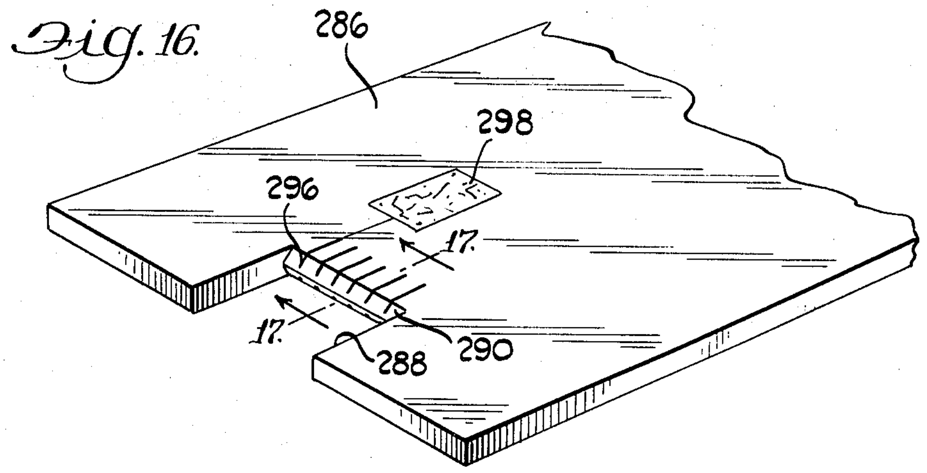
Figure 17:
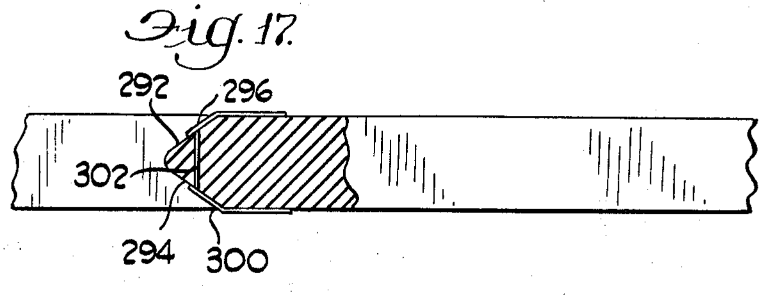
Figure 18:
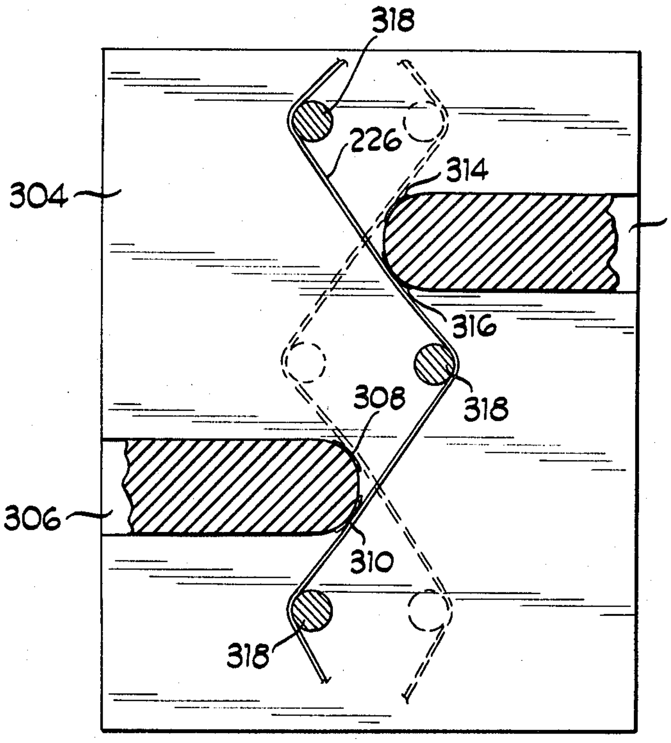

FIG: 13 is an elevational sectional view of a still further modified form of the present invention;

FIG. 14 is an elevational sectional view of yet another modified form of the present invention;

FIG. 15 is an elevational view taken substantially on line 15—15 of FIG. 14;

FIG. 16 is a view in perspective of a further modified form of the present invention;

FIG. 17 is an enlarged fragmentary sectional view taken substantially on line 17—17 of FIG. 16; and FIG. 18 is an elevational sectional view of yet another modified form of the present invention.

The present invention is concerned with the connection of conductored flat cable with electrical components. The cable may be what is known as the "flex-film" or the "flex-print" type and are commonly made of Mylar, or similar plastic material, of a thickness of approximately 0.0001 to 0.005 inches. The conductors may be formed in any suitable manner such as electrodeposition, photochemical etching or the erosion of copper in preselected areas by means of ferric chloride after deposition of a masking compound such as Kodak Photo-etch resist solution. The rows of spaced conductors may be covered by a thin dielectric film layer or coating. This invention contemplates the connection of uncoated conductored cable with other electrical elements and also contemplates the connection of coated cables to electrical elements by the utilization of preselected portions of the conductors by stripping the coating or film layer at selected points. This stripping may be accomplished mechanically or chemically by erosion of the coating or layer after application of a suitable protective coating. These stripped areas may be formed into contacts by means of the deposition of conductive metallic materials such as gold, palladium, rhodium, tin, lead, nickel, kovar, silver, or the like.

The invention contemplates a complete electrical system in which a multi-layered cable having a plurality of conductors on each layer may be connected temporarily or permanently to other electrical elements. To this end, it is contemplated that multi-layered cable be modified for selective electrical interconnection between the conductors of one layer of the cable and the conductors of another layer of the cable. This interconnection may be effected by means of selective piercing of certain of the layers followed by electrodeposition of conductive materials, soldering, metallic partical deposition or percussive welding. This interconnection of layers of multi-layered cable may be used not only to connect the conductors of certain layers of the cable each with the other, but also to connect certain of the conductors of certain layers with the integral contact rows on the outer cable surface. The invention also contemplates the provision of contact modifier strips having electrical connection between contact areas on one side thereof and certain other contact areas on the other side thereof.

The invention also contemplates the provision of an electrical connector in which a housing is provided in which may be received a plurality of superposed conductored cables of the type above described with means for exerting a tension force on said cables so that a component compressive force is exerted between the several superposed cables and other electrical components. It is contemplated that these interconnections be effected in an inert atmosphere.

The invention contemplates the provision of dielectric layers of sheet material between the conductored layers of cable and contemplates bonding of these layers each to the other by epoxy type resins or the like. To prevent strain and possible breakage of the internal layer of the electrical interconnections, it is contemplated that rigid adhesive reinforcing be provided in certain interconnection areas only; not all areas receive rigid adhesive because breakage would result. It is preferred that the cable be somewhat flexible, and, for this reason, the use of a flexible adhesive is preferred.

Figure 2:
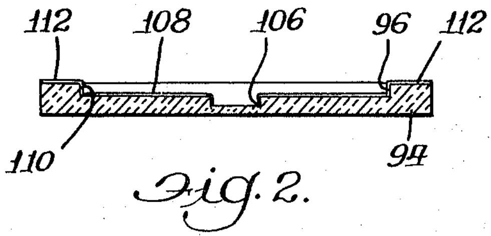
FIG. 2 is a sectional view taken substantially on line 2—2 of FIG. 1.
Figure 1:
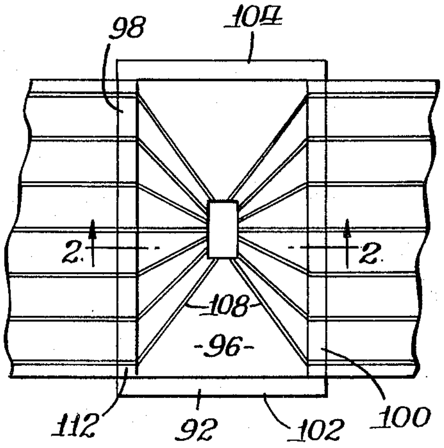
FIG. 1 is a plan view of a connector plate for electrically connecting flat conductored cable to a miniaturized integrated or hybrid circuit.

Referring now to the drawings, and more particularly to the FIG. 1, the electrical connector of the present invention is indicated generally by reference numeral 10 and includes a housing 12 having an upper cored section 14 and a lower cored section 16. The section 14 is formed with a plurality of transversely extending cores 18 delineated by spaced depending projections 20, while the section 16 is formed with a plurality of transversely extending cores 22 delineated by upwardly extending projections 24. The projections 24, as seen best in FIG. 2, are interposed between the projections 20 so as to form a tortuous path therethrough from left to right, as viewed in FIG. 2. Extending through the path thus formed are a pair of conductored cables 26 and 28. Between these cables is a tension strap 30 which is secured at the left end, as viewed in FIG. 2, to the lower section 16 at 32 and secured at the right end thereof to a tensioner 34, which is illustrated as being of the cam type.

Figure 3:
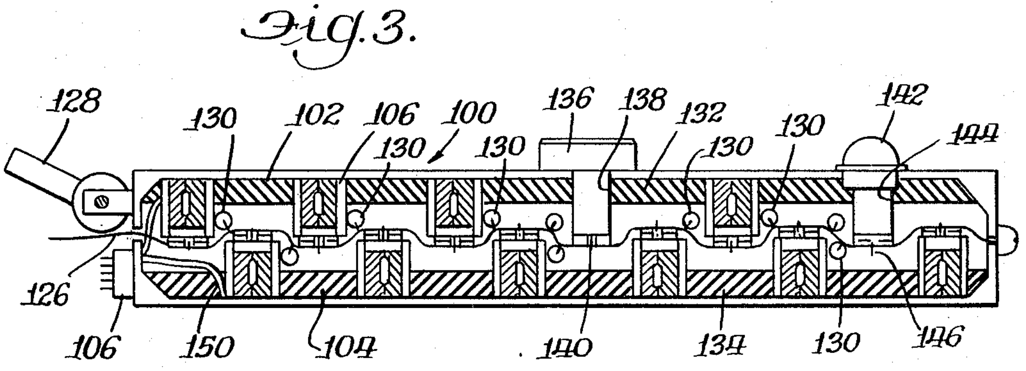
FIG. 3 is an elevational sectional view of an electrical connector system made in accordance with the present invention.
Figure 4:
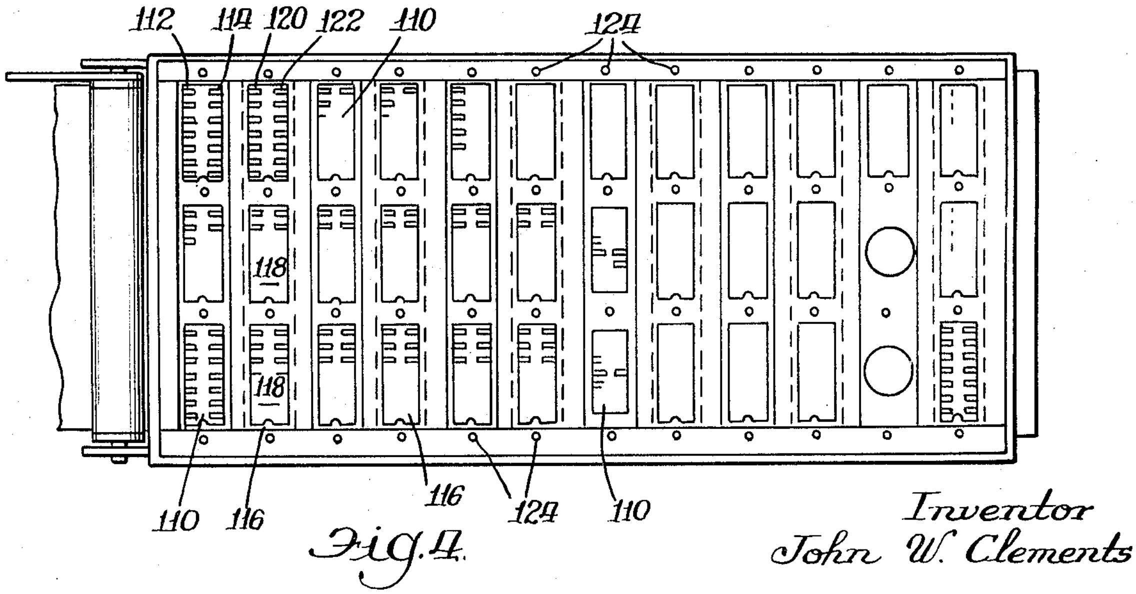
FIG. 4 is a plan view of the connector of FIG. 3, certain elements being removed for the sake of clarity.

The conductors 26 and 28 are desirably formed with external contact rows as seen best in FIGS. 3 and 4. To the external contact rows of the cables 26 and 28 may be secured electrical elements such as microcircuit wafers 36. Plugs 38 and 40 are provided to connect the housing 12 to other suitable electrical units. It will be appreciated that the cables may emerge from the housing 12 and will be connected to other interconnection panels or other equipment.

In FIG. 3 is illustrated a slightly modified form of the invention in which a tension strap 42 is interposed between a plurality of multi-layered cables 44, 46, 48 and 52. It will be appreciated that these cables are illustrated in spaced relation for the sake of clarity. The layer 44 has a plurality of longitudinally extending transversely spaced contact areas 54 which are illustrated in a position for electrical contact with a similar series of contact areas 56 on the cable 46. In like manner the cable 48 has a series of surface contact areas 58 for engagement with contact areas 60 on layer 52 when tension is exerted on the strap 42. It will be appreciated that compressive forces as indicated by the arrows are exerted when the strap 42 is tensioned.

Figures 5, 6, 7, 8, 9, 10, 11:
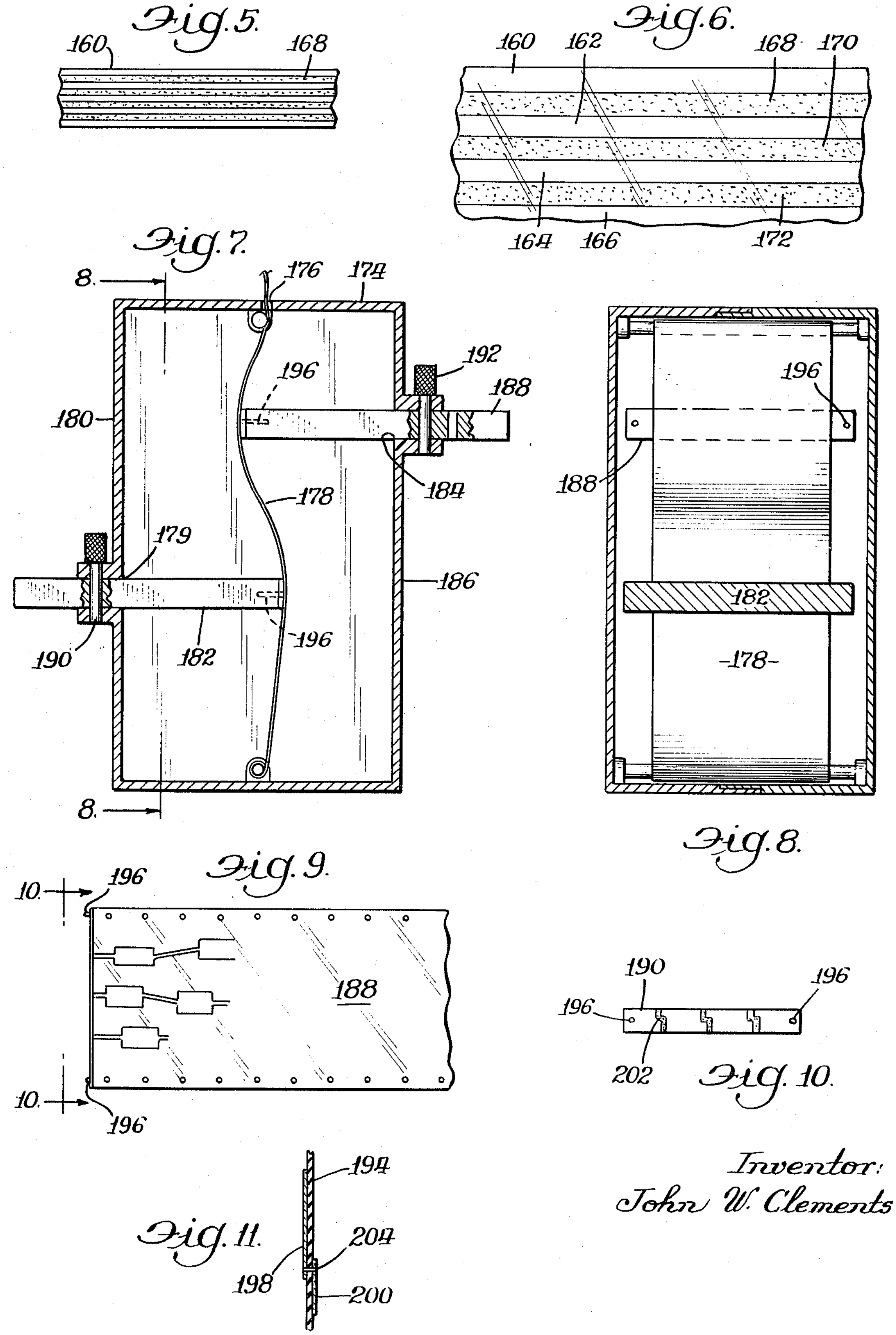
FIG. 5 is an enlarged fragmentary elevational sectional view of a multi-conductored cable forming a part of a modified form of the present invention.
FIG. 6 is an enlarged fragmentary view of the cable of FIG. 5.
FIG. 7 is an elevational sectional view of a further modified form of the present invention.
FIG. 8 is an elevational sectional view taken substantially on line 8—8 of FIG. 7.
FIG. 9 is a plan view of a circuit card having mounted at one edge thereof a programmed modifier strip.
FIG. 10 is a view taken substantially on line 10—10 of FIG. 9.
FIG. 11 is a greatly enlarged cross-sectional view of the programmed modifier strip of FIG. 10.

Referring now more particularly to FIGS. 4 and 4*a*, the multi-layered cable of the present invention is illustrated as comprising a plurality of superposed dielectric layers 62, 64, 66 and 68. Through all of these layers extend a plurality of longitudinally spaced alignment ferrules 70 for reception of alignment pins 72, see FIG. 2. The layer 62, in this instance, is a dielectric film having a plurality of longitudinally spaced stripped areas 76 exposing a plurality of longitudinally extending transversely spaced conductor 78 on the surface of the layer 64. The exposed conductor 78 form surface contact areas similar to areas 54, 56, 58 and 60 in FIG. 3. In addition, the layer 62 may be precisely pierced as at 80 to afford electrical communication to the other layers depending upon the depth of the depression formed. In FIG. 5 is illustrated a typical punch which may be utilized to effect this selective piercing. The punch is indicated generally be reference numeral 82 and includes an anvil 84 and a die 86. The die 86 has a plurality of pins 88 arranged to afford a preselected piercing pattern. The anvil 84 has corresponding apertures 90 to receive the pins 88. The multi-layered cable may take the form of a flattened sleeve in which electrical communication is provided between certain of the layers before the sleeve is flattened. Alternately the area 76 may be eliminated and the layer 62 may be stripped only in the areas of the conductor 78. In that event the slits thus formed may be filled with conductored material by electro-deposition or the like.

Referring now to FIG. 1, there is illustrated therein a connector made in accordance with the invention in which electrical connection may be afforded between a flat conductored cable and an integrated circuit. In this instance the connector is represented by reference numeral 92 and includes a ceramic body 94 having a central recess 96 defined by sidewalls 98 and 100 and endwalls 102 and 104. Within the recess 96 is a smaller recess 106 in which is received a typical integrated circuit. Formed in the surface of the recess 96 are a plurality of conductive paths 107 which are integrally formed with vertical conductive paths 110 which in turn are electrically joined to contact areas 112 on top of the walls 98 and 100. In lieu of the conductive paths 107, flat wire leads may be employed. By this arrangement, a flat conductored cable such as illustrated in FIG. 6 may be brought in electrical engagement with the integrated circuit in the recess 106 by merely bringing the conductors of the cable into electrical engagement with the contact areas 112. This engagement may be effected by any suitable means or may be effected by tensioning devices which exert component compressive forces of the type illustrated herein.

Referring now to FIGS. 3 and 4, there is illustrated therein a connection system form of the present invention including a housing 100 having an upper section 102 and a lower section 104. At the left side of the lower section 104 is a power supply plug 106. Extending across the upper section 102 are a plurality of receptacles 108 for reception of leadless microcircuit wafers 110 having at each side thereof rows of contacts 112 and 114. In like manner lower section 104 is provided with transversely extending receptacles 116 for reception of leadless microcircuit wafers 118 having at each side thereof rows of contacts 120 and 122. Alignment pins 124 are arranged in longitudinally spaced relation at each side of the housing for accurate reception of one or more flat cables of the type above described. In this instance filter capacitors 130 may be secured directly to external contact areas on the cables. An insulation layer 132 is provided for the upper section while an insulation layer 134 is provided for lower section 104. A meter 136 may be received in an opening 138 and may have a contact pin 140 for engaging preselected areas of the conductored cables. In like manner a visual indicating lamp 142 is received in an opening 144 and has a contact pin 146 extending through preselected conductive areas of the cables. In the alternative, the indicating lamp may have stemmed contacts for reception in a suitable socket in the upper cable. A supply lead 150 is provided for a thermocouple system. The wafers 110 are connected to the cold junction of the thermocouple while wafers 116 are also connected to the cold junction of the thermocouple. The hot junctions contact the walls of housing. By this arrangement heat is effectively removed from the housing 110. In the alternative, conventional refrigerator coils may be employed.

To afford electronic immunity to external electronic noise or impulses the housing, containing microcircuits, may have conductive coatings or metal foil applied to the outer surfaces thereof for shielding purposes.

In FIGS. 5 and 6 is illustrated a multi-layered conductored cable made in accordance with a modified form of the present invention. This cable, which may comprise a plurality of superposed multi-conductored cables, is desirably formed in a manner that the surfaces thereof are subject to a permanent residual tension force because of internal prestressing effected by the application of heat after irradiation by X-rays or the like. The cable of this modified form of the invention includes a plurality of individual cables 160, 162, 164 and 166 between which are interposed layers of sheet dielectric material 168, 170 and 172. It is preferred that the dielectric material by characterized by a different coefficient shrinkage under heat or irradiation conditions than the cable film so that the desired internal stressing is effected. If desired, the multi-layered cable of this modified form of the invention may include one or more shielding layers of metallic foil or the like.

FIG. 7 illustrates the environment in which the modified form of cable may be utilized. The connector illustrated in FIG. 7 includes a housing 174 having an opening 176 for reception of a cable 178 which is preferably of the multi-layered thru conductored type. An opening 178 is formed in wall 180 thereof for reception of a circuit card 182. In like manner, an opening 184 is formed in wall 186 for reception of a circuit card 188. Circuit card 182 is apertured for reception of a pin 190 while the circuit card 188 is apertured for reception of a pin 192. The circuit cards 182 and 188 are inserted to the positions illustrated and locked in that position by means of the pins 190 and 192. This exerts a pressure on the cable 178 which has on each side thereof a plurality of longitudinally extending laterally spaced conductor runs in engagement with edge contacts on the circuit cards 182 and 188. The cable 178 may then be subject to heat, irradiation or the like to effect internal shrinkage of the tension strap to assure the reliability of its contact with the edge contacts of the circuit cards.

The flow of electrons between the circuit cards and the cable 178 may be effectively modified as desired by the use of a programmed modifier strip 194 which may be mounted in proper alignment with respect to the conductors of the cable by means of alignment pins 196. The strip 190 may have thereon conductor runs to effect any desired electrical path. These runs may be formed by electrodeposition or the like. For instance, FIG. 11 illustrates a greatly enlarged modifier strip in which a conductor run 198 is disposed on one side of the strip and extends transversely thereof to engage one of the adjacent spaced edge contacts of a circuit card. On the other side thereof is a run 200 which is longitudinally spaced from the run 198, extends transversely on the strip, and is adapted to be engaged by an edge contact of an adjacent circuit card which is longitudinally spaced, with respect to the strip from the run 198. Runs 198 and 200 may be connected by a run 202 and a thru layered interconnection 204. Thus, contacts of a circuit card may be electrically connected, each to the other, or may be selectively connected to one or the other of a plurality of cable contacts. Microcircuit wafers may also employ contacts modifier strips in a similar manner.

Figure 12:
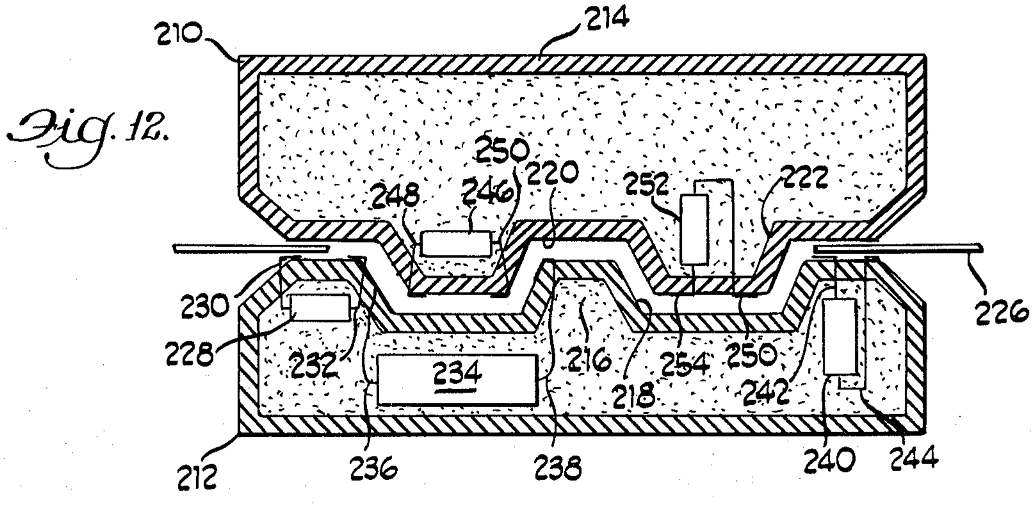
FIG. 12 is an elevational sectional view of a further modified form of the present invention.

In FIG. 12 is illustrated a further modified form of the present invention in which a connector 210 is formed with a base 212 and a lid portion 214. Each of these elements may be hollow in construction and formed of a suitable dielectric material such as plastic or the like and may be filled with a suitable potting compound as illustrated. The base 212 is formed with a plurality of protuberances 216, frustoconical in cross section and separated each from the other by grooves 218 also frustoconical in cross section. The lid portion 214 is formed with a frustoconical recess 220 for reception of the protuberance 216 and is formed with a plurality of protuberances or projections 222 which are received in the recesses 218. The elements 212 and 214 are illustrated in exploded relation and a flat flexible multi-conductored cable 226 is illustrated between these elements. It will be appreciated that the elements 212 and 214 may be brought together with the cable 226 locked therebetween. The base 212 is illustrated as having mounted therein various electrical components having leads extending through the top wall thereof for engagement by the conductor runs of the cable 226. For instance, component 228 may be a microcircuit and is shown as provided by leads 230 and 232. Component 234 may be a capacitor filter or the like and is provided with leads 236 and 238. Component 240 may be an integrated circuit having leads 242 and 244. In like manner, component 246 is mounted in the lid portion 214 and is formed with leads 248 and 250. Also, component 252 is formed with leads 254 and 256.

Figure 13:
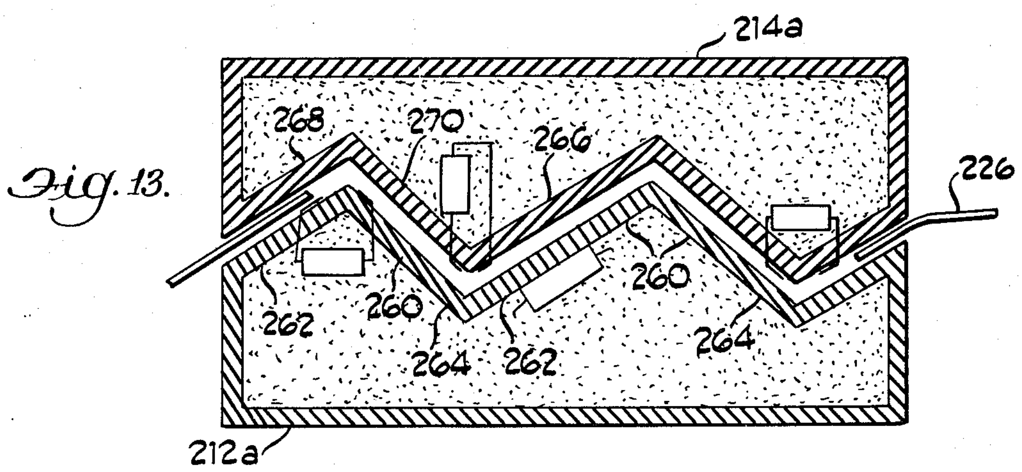

In FIG. 13 is illustrated a further modified form of the present invention in which a base section 212*a* is formed with a plurality of ribs 260 having sloping surfaces 262 and 264 for meeting reception of a lid portion 214*a* having ribs 266 formed with sloping surfaces 268 and 270. As in the form of the invention illustrated in FIG. 12, the cable 226 is locked between the sections 212*a* and 214*a* for electrical connection with the leads of the several electrical components illustrated.

FIG. 14 illustrates another modified form of the present invention in which a flat flexible multi-conductored cable 226 is received in a housing 272 having an opening 274 at the top thereof and an opening 276 at the bottom thereof. Mounted within the mounting 272 in vertically spaced relation are a plurality of circuit cards 278 having at the inner ends thereof edge contacts 280. Also mounted within the housing 272 in vertically spaced relation are a plurality of circuit cards 282 having edge contacts 284. The circuit cards 282 are alternately disposed with respect to the circuit cards 278 and are moved towards each other after the cable 226 has been inserted to the position illustrated. Applicant has found that a flexible cable of sufficient rigidity can be brought into conductive engagement with circuit cards merely by forcing the series of circuit cards towards each other in the position illustrated. It is preferred, of course, that the circuit cards be locked in position.

In FIG. 16 is illustrated a further modified form of the present invention in which a circuit card 286 is formed with a notch 288. The notch 288, in the illustrated embodyment, is defined in part by an edge 290 having intersecting sloping sections 292 and 294. The section 292 has formed thereon, as by printing, electrodeposition or the like spaced contact zones 296 which are in electrically conductive relation to electrical component 298 and other components formed on the surface of the circuit card. A plurality of contact zones 300 are formed on the surface 294 for electrical connection with electrical components on the lower surface of the circuit card, if desired. The invention contemplates that the edge 290 may have any desired configuration so long as a selection may be made between series of contact zones. The invention also contemplates electrical interconnection between the contacts 296 and the contacts 300 by means of thru layered interconnections 302. A flat multi-conductored cable may be selectively brought into conductive relation with either the contacts 296 or the contacts 300 merely by inserting the circuit card 286 in a housing similar to that illustrated in FIG. 14 in either the position illustrated or in obverse relation. For example, the card 286 may be mounted upside down to effect electrical connection of the contacts 300 where the contacts 296 were formerly in engagement with the cable.

FIG. 18 illustrates a further modified form of the invention in which means are provided for selectively connecting series of edge contacts on circuit cards. In this form of the invention a housing 304 has mounted therein a plurality of vertically spaced circuit cards 306 (only one of which is shown). Each circuit card 306 has a rounded edge formed by rounding the corners about separate arcs. An upper series of spaced contacts 308 are formed on the upper rounded corner and a lower series of spaced contacts 310 are formed on the lower corner. Also mounted within the housing 304 are a plurality of vertically spaced circuit cards 312 (only one of which is shown). Each circuit card 312 has an inner edge having the same configuration as the circuit cards 306 and is provided with an upper series of spaced contacts 314 and a lower series of spaced contacts 316. According to the present invention, means are provided for selectively directing the cable 226 into conductive engagement with the contacts 316 of the cards 312 with the contacts 310 of the cards 306, or connecting the contacts 314 of the cards 312 with the contacts 308 of the cards 306. Illustrated in solid lines are pins 318 which are suitably mounted in the side walls of the housing 304 in the position illustrated so that the cable 226 follows the path illustrated in solid lines. The pins 318 may be moved to the positions illustrated in dotted lines to effect the connection of the contacts 314 with the contacts 308. It is contemplated that the ends of the pins 318 be mounted in suitable slots in the side walls of the housing 304 so that they can be readily moved and locked in the position illustrated.

I claim:

1. An electrical connector comprising an elongated first housing section having a plurality of longitudinally and laterally spaced microcircuit wafers disposed within said housing section, an elongated second housing section having a plurality of longitudinally and laterally spaced microcircuit wafers disposed within said second housing section and interleaved with the wafers of said first housing section, said first and second housing sections having an opening for reception of a flat, flexible multi-conductored cable and tension means for exerting a compressive force biasing said cable into electrically conductive relation to said wafers in said first and second housing sections.

2. A connector in accordance with claim 1 wherein the wafers of said first section and said second section are disposed in a plurality of laterally spaced rows of longitudinally spaced wafers.

3. An electrical connector in accordance with claim 2 wherein cooling means are provided for said housing.

4. A connector in accordance with claim 3 wherein said cooling means comprise a thermoelectric device disposed in operative relation to the microcircuit wafers.

5. A connector in accordance with claim 4 wherein a programmed modifier strip is interposed between the cable and at least one of the microcircuit wafers.

6. A connector in accordance with claim 5 wherein said cable is tensioned by an irradiated plastic tension strap.

* * * * *